United States Patent
Hada et al.

(10) Patent No.: US 7,312,015 B2
(45) Date of Patent: Dec. 25, 2007

(54) PROCESS FOR REFINING CRUDE RESIN FOR ELECTRONIC MATERIAL

(75) Inventors: Hideo Hada, Kawasaki (JP); Takeshi Iwai, Kawasaki (JP); Masaru Takeshita, Kawasaki (JP); Ryotaro Hayashi, Kawasaki (JP); Masaaki Muroi, Kawasaki (JP); Kota Atsuchi, Kawasaki (JP); Hiroaki Tomida, Kawasaki (JP); Kazuyuki Shiotani, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 38 days.

(21) Appl. No.: 10/543,263

(22) PCT Filed: Jan. 28, 2004

(86) PCT No.: PCT/JP2004/000776

§ 371 (c)(1),
(2), (4) Date: Jul. 25, 2005

(87) PCT Pub. No.: WO2004/067688

PCT Pub. Date: Aug. 12, 2004

(65) Prior Publication Data

US 2006/0141384 A1 Jun. 29, 2006

(30) Foreign Application Priority Data

Jan. 29, 2003 (JP) .............................. 2003-020584
Dec. 8, 2003 (JP) .............................. 2003-409329

(51) Int. Cl.
*G03C 1/76* (2006.01)
*G03C 1/492* (2006.01)
*G03C 1/494* (2006.01)
*C08F 6/00* (2006.01)
*C08J 3/00* (2006.01)

(52) U.S. Cl. .............................. 430/270.1; 528/502 A
(58) Field of Classification Search ............. 430/270.1; 528/502
See application file for complete search history.

(56) References Cited

U.S. PATENT DOCUMENTS

| | | | |
|---|---|---|---|
| 6,579,659 B2 | 6/2003 | Uetani et al. | |
| 6,639,035 B1 | 10/2003 | Chen et al. | |
| 2001/0026901 A1 | 10/2001 | Maeda et al. | |
| 2003/0114589 A1 | 6/2003 | Suetsugu et al. | |
| 2003/0181763 A1 | 9/2003 | Murata et al. | |
| 2003/0211734 A1 | 11/2003 | Maeda et al. | |
| 2006/0135745 A1* | 6/2006 | Hada et al. ............. | 528/502 A |

FOREIGN PATENT DOCUMENTS

| | | |
|---|---|---|
| JP | 06-289614 | 10/1994 |
| JP | 2002-201232 | 7/2002 |

OTHER PUBLICATIONS

Office Action for the corresponding Chinese Patent Application No. 2004-80002954.0 (issued on Jul. 14, 2006).
Office Action for the corresponding Korean Patent Application No. 10-2005-7013728 (issued on Jul. 21, 2006).

* cited by examiner

*Primary Examiner*—Geraldina Visconti
(74) *Attorney, Agent, or Firm*—Knobbe Martens Olson & Bear LLP

(57) ABSTRACT

A process is provided for effectively removing by-products such as oligomers contained within a crude resin for an electronic material, thus producing a resin for an electronic material. In this process, a crude resin for an electronic material containing (a1) structural units derived from a (meth)acrylate ester with a hydrophilic site is washed using (b1) an organic solvent which is capable of dissolving said crude resin for an electronic material and which separates into two layers when combined with water, and (b2) water.

14 Claims, No Drawings

PROCESS FOR REFINING CRUDE RESIN FOR ELECTRONIC MATERIAL

This is the U.S. National Phase under 35 U.S.C. § 371 of International Patent Application No. PCT/JP2004/000776, filed Jan. 28, 2004, which claims priority to Japanese Patent Application No. 2003-20584, filed Jan. 29, 2003 and Japanese Patent Application No. 2003-409329, filed Dec. 8, 2003.

TECHNICAL FIELD

The present invention relates to a process for refining a crude resin for an electronic material, a resin for an electronic material produced by such a refining process, a process for producing a chemically amplified photoresist composition using such a resin for an electronic material, and a chemically amplified photoresist composition comprising such a resin for an electronic material.

BACKGROUND ART

Typical examples of electronic material resins that are used as the resin component of photoresists used during the production of electronic devices such as semiconductor elements, liquid crystal elements and magnetic heads and the like include polyhydroxystyrene based resins (such as resins in which a portion of the hydroxyl groups are protected with acid dissociable, dissolution inhibiting groups, copolymers of hydroxystyrene units and styrene units, and copolymers of hydroxystyrene units and (meth)acrylate esters) in the case of KrF resist resins, and (meth)acrylate ester copolymer based resins in the case of ArF resist resins.

Examples of processes for refining these types of electronic material resins include the processes disclosed in the patent reference 1 listed below in the case of the former type polyhydroxystyrene based resins, and the processes disclosed in the patent reference 2 listed below in the case of the latter type (meth)acrylate ester copolymer based resins.

The patent reference 1 discloses a process in which the resin is dissolved in a polar solvent such as N-methylpyrrolidone and an aliphatic hydrocarbon based solvent, and following phase separation the resin is obtained from the polar solvent layer, as well as a process in which the resin is dissolved in a lower alcohol, and is then added to a poor solvent such as water to precipitate the polymer.

The patent reference 2 discloses a process in which the resin is refined using an aliphatic hydrocarbon such as n-hexane, or a mixed solvent of an aliphatic hydrocarbon and ethyl acetate.

Patent Reference 1: Japanese Unexamined Patent Application, First Publication No. Hei 6-289614
Patent Reference 2: Japanese Unexamined Patent Application, First Publication No. 2002-201232

However, when a crude resin for an electronic material containing structural units derived from a (meth)acrylate ester with a hydrophilic site such as a lactone is refined using these types of processes, even if the unreacted monomer is able to be removed to some extent, the removal of materials of comparatively high polarity such as by-product oligomers or low molecular weight polymers is particularly difficult. Consequently, the use of resins containing these types of by-products that are difficult to remove as components of electronic materials is unavoidable.

For example, when an ArF chemically amplified photoresist composition is prepared using a resin containing by-products such as the oligomers and the like described above, although the various characteristics such as the sensitivity, the resolution, and the resist pattern shape are satisfactory, the number of defects (surface defects) in the resist pattern following developing can become problematic. These defects refer to general problems such as scum and bridging between resist patterns detected by inspecting the developed resist pattern from directly overhead using a surface defect observation apparatus manufactured by KLA Tencor Corporation (brand name "KLA").

Furthermore, during storage as a resist solution (a photoresist composition in solution form), problems may also develop in terms of the storage stability as a resist solution, resulting in the development of fine particles in the solution. Moreover, if these fine particles develop, they can cause the type of defects described above, meaning improvements in the storage stability as a resist solution are needed in order to improve the level of defects.

DISCLOSURE OF INVENTION

The present invention takes the above problems associated with the conventional art into consideration, with an object of providing a process for refining a crude resin for an electronic material that enables the effective removal of by-products such as oligomers contained within the crude resin for an electronic material, as well as a resin for an electronic material produced by such a refining process, a process for producing a chemically amplified photoresist composition using such a resin for an electronic material, and a chemically amplified photoresist composition comprising such a resin for an electronic material.

Furthermore, in the aspect of the invention relating to a chemically amplified photoresist composition, the present invention has an object of improving the level of defects and the storage stability as a resist solution, without impairing characteristics such as the resolution, the resist pattern shape and the sensitivity.

As a result of intensive investigations aimed at resolving the above problems, the inventors of the present invention discovered that by washing a crude resin for an electronic material containing (a1) structural units derived from a (meth)acrylate ester with a hydrophilic site using (b1) an organic solvent which is capable of dissolving the crude resin for an electronic material and which separates into two layers when combined with water, and (b2) water, the problems described above could be resolved, and they were hence able to complete the present invention.

In other words, a first aspect of the present invention is a process for refining a crude resin for an electronic material, wherein a crude resin for an electronic material containing (a1) structural units derived from a (meth)acrylate ester with a hydrophilic site is washed using (b1) an organic solvent which is capable of dissolving the crude resin for an electronic material and which separates into two layers when combined with water, and (b2) water.

A second aspect of the present invention is a resin for an electronic material produced by the above refining process.

A third aspect of the present invention is a process for producing a chemically amplified photoresist composition using an aforementioned resin for an electronic material.

A fourth aspect of the present invention is a chemically amplified photoresist composition comprising an aforementioned resin for an electronic material.

The term "(meth)acrylic acid" refers to either one of, or both, methacrylic acid and acrylic acid. The term "structural unit" refers to a monomer unit that contributes to the formation of a polymer. The term "lactone unit" refers to a group in which one hydrogen atom has been removed from a monocyclic or polycyclic lactone. The term "crude resin for an electronic material" describes a resin in the unrefined state immediately following polymerization of a resin for use in the preparation of electronic devices such as semiconductor elements, liquid crystal elements and magnetic heads and the like.

According to the present invention, there are provided a process for refining a crude resin for an electronic material that enables the effective removal of by-products such as oligomers contained within the crude resin for an electronic material, as well a resin for an electronic material produced by such a refining process, a process for producing a chemically amplified photoresist composition using such a resin for an electronic material, and a chemically amplified photoresist composition comprising such a resin for an electronic material.

BEST MODE FOR CARRYING OUT THE INVENTION

As follows is a sequential description of one example of a process for refining a crude resin for an electronic material according to the present invention.

First, a crude resin is prepared by a typical polymerization reaction. In other words, at least one monomer that generates the structural units of the target resin is first dissolved in a typical polymerization solvent. Examples of typical polymerization solvents include tetrahydrofuran, dioxane, and methyl ethyl ketone. Next, a known polymerization initiator such as azobisisobutyronitrile is added to the solution, and the polymerization is conducted by heating, preferably at 50 to 80° C. for a period of 2 to 6 hours.

In a refining process of the present invention, (i) a crude resin for an electronic material produced at the completion of the above polymerization reaction, which contains (a1) structural units derived from a (meth)acrylate ester with a hydrophilic site is (ii) washed using (b1) an organic solvent which is capable of dissolving the crude resin for an electronic material and which separates into two layers when combined with water, and (b2) water.

The washing step defined in (ii) above is described as the washing step of the present invention.

Either prior to, following, or both prior to and following the washing step of the present invention, the resin may be further washed using a hydrophobic solvent (hereafter referred to as a hydrophobic solvent washing step).

Providing a hydrophobic solvent washing step prior to the washing step of the present invention is preferred, as both unreacted monomers, and oligomer and low molecular weight polymer by-products can be removed, enabling a further improvement in the defect reduction effect.

As follows is a description of the case in which an aforementioned hydrophobic solvent washing step and a washing step of the present invention are conducted sequentially.

In the hydrophobic solvent washing step, the reaction liquid containing a dissolved first crude resin that is generated at the completion of the polymerization reaction is poured into a hydrophobic solvent. Examples of suitable hydrophobic solvents include aliphatic hydrocarbons such as pentane, 2-methylbutane, n-hexane, 2-methylpentane, 2,2-dibutylbutane, 2,3-dibutylbutane, n-heptane, n-octane, isooctane, 2,2,3-trimethylpentane, n-nonane, 2,2,5-trimethylhexane, n-decane and n-dodecane, and of these, n-hexane and n-heptane are particularly preferred. A quantity of the hydrophobic solvent equivalent to at least 2-fold the mass, and preferably from 4 to 5-fold the mass of the polymerization solvent enables better removal of impurities such as the unreacted monomer, and is consequently preferred. Following the pouring of the first crude resin into the hydrophobic solvent, the mixture is preferably stirred or shaken at 10 to 40° C., and preferably from 20 to 30° C., for a period of 10 to 60 minutes, and preferably from 25 to 35 minutes, thereby precipitating the crude resin as a solid. A second crude resin is obtained by filtering off this precipitated solid.

By providing this type of hydrophobic solvent washing step, the majority of the unreacted monomer from the polymerization reaction can be dissolved in the hydrophobic solvent and removed.

This hydrophobic solvent washing step can also be repeated if necessary. In other words, the second crude resin obtained in the hydrophobic solvent washing step can be redissolved in a polymerization solvent such as tetrahydrofuran, and the operation of adding more of the hydrophobic solvent and then filtering off the precipitated crude resin can be repeated.

Next, the second crude resin obtained in the hydrophobic solvent washing step is transferred to the washing step of the present invention. In this step, first the second crude resin is dissolved in (b1) an organic solvent which is capable of dissolving the above crude resin for an electronic material and which separates into two layers when combined with water. The concentration of the thus prepared solution of the second crude resin in this organic solvent (b1) is preferably within a range from 5 to 10% by weight, and even more preferably from 6 to 8% by weight. By ensuring a concentration within this range, the separation of the solvent layer from the water layer, and the degree of removal of impurities such as oligomers can both be improved.

Subsequently, water is poured into the solution of this organic solvent (b1). There are no particular restrictions on the relative quantities (the weight ratio) of the organic solvent (b1) and water, provided separation into two layers is possible, although an organic solvent (b1): water ratio within a range from 1:1 to 4:1 is preferred, and a ratio from 2:1 to 3:1 is even more desirable. If the proportion of water is less than a 4:1 ratio, then an adequate washing effect cannot be realized, whereas if the ratio exceeds 1:1, the quantity of the organic solvent (b1) that dissolves in the water increases, thereby increasing the quantity of the target resin that is removed with the water layer, and thus reducing the yield, reducing productivity, and increasing costs.

Because a more satisfactory washing effect is achieved by first dissolving the second crude resin in the organic solvent (b1), a solution of the organic solvent (b1) is preferably prepared prior to the washing process.

Following the pouring of water into the solution of the second crude resin in the organic solvent (b1), the mixture is preferably stirred or shaken at 10 to 40° C., and preferably from 20 to 30° C., for a period of 10 to 60 minutes, and preferably from 25 to 35 minutes to effect the washing process.

Subsequently, when the stirring is halted and the liquid is allowed to settle, a two layer system develops with the layer of the organic solvent (b1) as the top layer and the water layer as the bottom layer. By removing the bottom water layer from this two layer system, a solution of the target resin for an electronic material dissolved in the organic solvent (b1) can be obtained. Repeated washing may then be conducted by pouring in additional water, and this washing operation is preferably repeated at least two times.

Subsequently, the electronic material resin can be produced by concentrating the solution of the electronic material resin in the organic solvent (b1), and then performing an additional distillation process or the like to remove any remaining water. The electronic material resin can either be obtained as a solid, or retained and used as a solution in the organic solvent (b1), as is required in the production of a chemically amplified photoresist.

By providing a washing step of the present invention as described above, oligomers and low molecular weight polymers, and particularly oligomers and low molecular weight polymers with a comparatively high polarity can be dissolved in the water layer and removed.

There are no particular restrictions on the organic solvent (b1) used in the washing step of the present invention, provided the solvent is capable of dissolving the above crude resin for an electronic material, and separates into two layers when combined with water, or in other words, is a solvent that is suitable for use in a two layer liquid-liquid washing process with water.

Examples of suitable organic solvents include glycol ether esters, esters and ketones. Specific examples include glycol ether esters such as propylene glycol monoalkyl ether acetates, esters such as ethyl acetate, butyl acetate and isoamyl acetate, and ketones such as 2-heptanone, methyl ethyl ketone, methyl isobutyl ketone, and cyclohexanone. These solvents can be used singularly, or in mixtures of two or more solvents.

Of the above solvents, propylene glycol monoalkyl ether acetates are preferred, as they offer a superior removal effect for oligomers and low molecular weight polymers, and particularly oligomers and low molecular weight polymers with a comparatively high polarity, contained within the crude resin. In those cases in which the resin is used as a chemically amplified photoresist composition, propylene glycol monomethyl ether acetate (PGMEA) is particularly preferred as it provides good safety levels for the resist solvent, superior resist characteristics such as resolution and pattern shape, and also enables a high level of efficiency in the resist preparation process. Suitable examples of the alkyl group in the propylene glycol monoalkyl ether acetate include lower alkyl groups such as methyl groups, ethyl groups, propyl groups and butyl groups.

The process for refining a crude resin for an electronic material according to the present invention is used for a crude resin for an electronic material containing (a1) structural units derived from a (meth)acrylate ester with a hydrophilic site. These types of electronic material crude resins are suited to use as the resin used in a chemically amplified photoresist composition.

Examples of the resins that can be used in a chemically amplified photoresist composition include the resin components of photoresist compositions used with KrF or ArF excimer lasers, or even shorter wavelengths.

Electronic material crude resins that contain at least 20 mol %, and preferably contain from 20 to 60 mol % of (a1) structural units derived from a (meth)acrylate ester with a hydrophilic site are particularly prone to the generation of oligomers and low molecular weight polymers, and particularly oligomers and low molecular weight polymers with a comparatively high polarity, and consequently the refining process of the present invention is particularly effective for such resins. If the above structural unit content exceeds 60 mol % then the hydrophilicity of the crude resin increases, and the quantity of the resin removed with the water layer during the washing step of the present invention becomes undesirably large.

There are no particular restrictions on (a1) the structural units derived from a (meth)acrylate ester with a hydrophilic site (hereafter referred to as (a1) units), although preferred examples include the structural units (a1-1) described below.

(a1-1) Structural units derived from a (meth)acrylate ester containing a lactone unit (hereafter referred to as (a1-1) units).

(a1-1) Units:

An (a1-1) unit is a structural unit containing a lactone unit on the ester side chain section of a (meth)acrylate ester. In the lactone unit, the ring containing the —O—C(O)— structure is counted as the first ring. Accordingly, the case in which the only ring structure is the ring containing the —O—C(O)— structure is referred to as a monocyclic group, and groups containing other ring structures are described as polycyclic groups regardless of the structure of the other rings.

Examples of the (a1-1) structural unit include monocyclic groups in which one hydrogen atom has been removed from γ-butyrolactone, and polycyclic groups in which one hydrogen atom has been removed from a lactone containing polycycloalkane.

Specifically, the structural units represented by the structural formulas (I) to (IV) shown below are preferred.

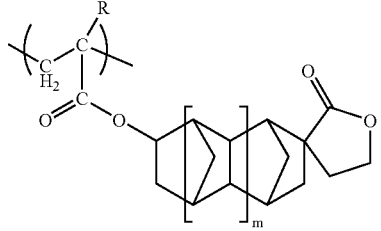
(I)

(wherein, R represents a hydrogen atom or a methyl group, and m represents either 0 or 1)

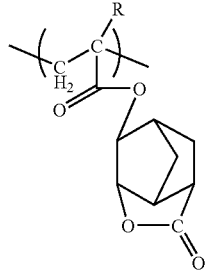
(II)

(wherein, R represents a hydrogen atom or a methyl group)

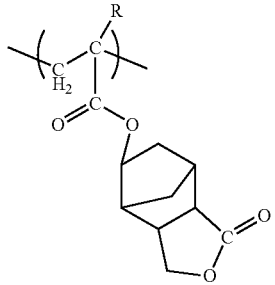
(III)

(wherein, R represents a hydrogen atom or a methyl group)

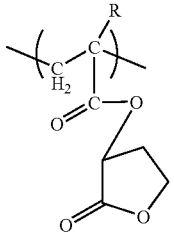
(IV)

(wherein, R represents a hydrogen atom or a methyl group)

The above structural units (a1) preferably account for 20 to 60 mol %, and even more preferably from 30 to 50 mol % of the total of all the structural units within the crude resin, as such proportions result in superior resolution when the resin is used as a chemically amplified photoresist resin.

A crude resin that is applicable to a refining process of the present invention utilizes a (meth)acrylate ester monomer with a hydrophilic site, and preferably a (meth)acrylate ester monomer containing a lactone unit, as the raw material monomer. When a crude resin is produced using this type of monomer, oligomers and low molecular weight polymers comprising a high proportion of structural units containing this highly hydrophilic lactone unit are generated as by-products.

If a conventional refining process is applied to this type of crude resin containing these by-products, then removal of the above types of highly hydrophilic by-products is difficult, whereas if the refining process of the present invention is employed, these highly hydrophilic by-products can be removed simply and effectively, enabling improvements in the level of defects, and the storage stability of the resin, both of which cause problems in chemically amplified photoresists.

A crude resin for an electronic material that is suitable for a refining process of the present invention preferably comprises structural units (a2) described below in addition to the above structural units (a1).

(a2) Structural units derived from a (meth)acrylate ester containing a hydrophobic group (hereafter referred to as (a2) units).

(a2) Units:

The hydrophobic group within the unit (a2) refers to a highly hydrophobic hydrocarbon group containing at least 6 carbon atoms, and preferably 10 or more carbon atoms, contained within the ester section of the (meth)acrylate ester. The hydrocarbon group may be either a chain-type or a cyclic hydrocarbon group, and specific examples include a hydrophobic group containing a tertiary alkyl group, a monocyclic group, or a polycyclic group. Of these, aliphatic type polycyclic hydrocarbon groups are preferred, as they result in superior resolution and dry etching resistance when the resin is used as a chemically amplified photoresist resin.

Examples of these (a2) units include the structural units (a2-1) and (a2-2) described below.

(a2-1) Structural units derived from a (meth)acrylate ester comprising an acid dissociable, dissolution inhibiting group containing a hydrophobic aliphatic monocyclic or polycyclic group (hereafter referred to as (a2-1) units).

(a2-2) Structural units derived from a (meth)acrylate ester comprising a non-acid dissociable group containing a hydrophobic aliphatic polycyclic group (hereafter referred to as (a2-2) units).

The term "non-acid dissociable" used in the description of the (a2-2) units does not mean that the group is chemically completely non-dissociable, but rather that the level of acid dissociability is lower than that of an (a2-1) unit and results in no significant resist patterning.

(a2-1) Units:

In terms of the acid dissociable, dissolution inhibiting group containing an aliphatic monocyclic or polycyclic group that is used as the hydrophobic group, suitable examples of the aliphatic monocyclic group include groups in which one hydrogen atom has been removed from a cycloalkane. Examples of the aliphatic polycyclic group include groups in which one hydrogen atom has been removed from a polycycloalkane such as a bicycloalkane, a tricycloalkane or a tetracycloalkane.

Specific examples include groups in which one hydrogen atom has been removed from cyclohexane in the case of an aliphatic monocyclic group, and groups in which one hydrogen atom has been removed from a polycycloalkane such as adamantane, norbornane, isobornane, tricyclodecane or tetracyclododecane in the case of an aliphatic polycyclic group.

This polycyclic group can be appropriately selected from the multitude of acid dissociable, dissolution inhibiting groups proposed for use within ArF excimer laser photoresist composition resins.

Of these groups, cyclohexyl groups, adamantyl groups, norbornyl groups, and tetracyclododecanyl groups are preferred in terms of industrial availability.

There are no particular restrictions on the above acid dissociable, dissolution inhibiting group, providing it is a group which can be used in a resin for a positive chemically amplified photoresist composition, and which dissociates under the action of acid, causing the resin to shift from an alkali insoluble state to an alkali soluble state.

Typically, groups in which a cyclic or a chain-type tertiary alkyl ester is formed at the carboxyl group of the (meth)acrylic acid are the most widely used.

Specifically, the structural unit (a2-1) is preferably at least one unit selected from a group consisting of the general formulas (V) to (VII) shown below.

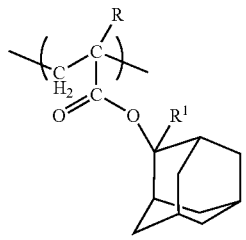

(V)

(wherein, R represents a hydrogen atom or a methyl group, and $R^1$ represents a lower alkyl group)

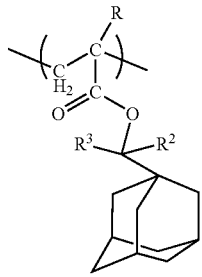

(VI)

(wherein, R represents a hydrogen atom or a methyl group, and $R^2$ and $R^3$ each represent, independently, a lower alkyl group)

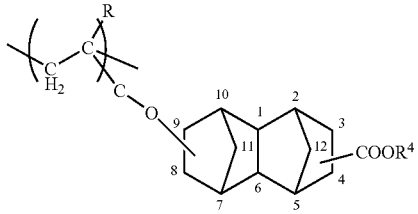

(VII)

(wherein, R represents a hydrogen atom or a methyl group, and $R^4$ represents a tertiary alkyl group)

Within the above formula, the group $R^1$ is preferably a straight chain or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. Of these, an alkyl group of at least 2 carbon atoms, and preferably from 2 to 5 carbon atoms, is preferred as it provides an acid dissociability that is greater than the case in which $R^1$ is a methyl group, and enables higher sensitivity. From an industrial viewpoint, a methyl group or an ethyl group is preferred.

The aforementioned groups $R^2$ and $R^3$ each preferably represent, independently, a lower alkyl group of 1 to 5 carbon atoms. These types of groups tend to display a higher acid dissociability than a 2-methyl-2-adamantyl group.

Specifically, the groups $R^2$ and $R^3$ preferably each represent, independently, the same types of straight chain or branched lower alkyl groups described above for $R^1$. Of these groups, the case in which $R^2$ and $R^3$ are both methyl groups is preferred in terms of industrial availability, and specific examples of the structural unit represented by the formula (VI) include structural units derived from 2-(1-adamantyl)-2-propyl (meth)acrylate.

The group $R^4$ represents a tertiary alkyl group such as a tert-butyl group or a tert-amyl group, although a tert-butyl group is preferred in terms of industrial availability.

Furthermore, the group —COOR$^4$ may be bonded to either position 3 or 4 of the tetracyclododecanyl group shown in the formula, although a mixture of both stereoisomers results, and so the bonding position cannot be further specified. Furthermore, the carboxyl group residue of the (meth)acrylate structural unit may be bonded to either position 8 or 9, although similarly, the bonding position cannot be further specified.

The above structural units (a2-1) preferably account for 20 to 60 mol %, and even more preferably from 30 to 50 mol % of the total of all the structural units within the resin, as such proportions result in superior resolution when the resin is used as a chemically amplified photoresist resin.

(a2-2) Units:

(a2-2) units comprise a non-acid dissociable group containing a hydrophobic aliphatic polycyclic group.

Examples of the aliphatic polycyclic group include the same groups described above in relation to the (a2-1) units, and any of the multitude of conventional groups proposed for use within ArF excimer laser photoresist composition resins can be used.

From the viewpoint of industrial availability, at least one of a tricyclodecanyl group, an adamantyl group or a tetracyclododecanyl group is preferred.

Specific examples of the (a2-2) unit include the units with the structures (VIII) to (X) shown below.

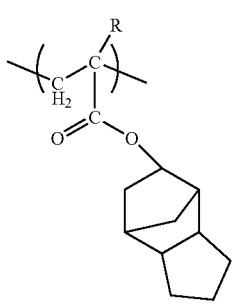

(VIII)

(wherein, R represents a hydrogen atom or a methyl group)

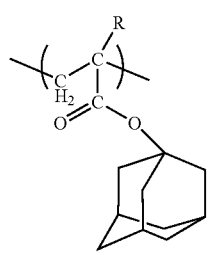

(IX)

(wherein, R represents a hydrogen atom or a methyl group)

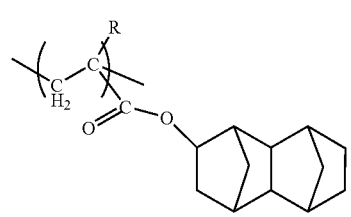

(X)

(wherein, R represents a hydrogen atom or a methyl group)

The above structural units (a2-2) preferably account for 1 to 30 mol %, and even more preferably from 5 to 20 mol % of the total of all the structural units within the resin, as such proportions result in excellent resolution for isolated patterns through to semi dense patterns when the resin is used as a chemically amplified photoresist resin.

In those cases where the crude resin to which the refining process of the present invention is applied is a resin comprising the (a1) units and (a2) units described above, the raw material monomers are a monomer containing a lactone unit with a comparatively high level of hydrophilicity, and a monomer with a hydrophobic group. When production of a crude resin is conducted using these monomers, highly hydrophilic oligomers and low molecular weight polymers comprising a large proportion of structural units containing a lactone unit, and highly hydrophobic oligomers and low molecular weight polymers comprising a large proportion of structural units containing a hydrophobic group are both generated as by-products.

If a conventional refining process is applied to this type of crude resin containing by-products, then removal of both of the above types of by-products is difficult, and in such cases, refining is preferably conducted by using a combination of both a washing step of the present invention and a hydrophobic solvent washing step. By first conducting a washing step of the present invention as described above, any high polarity by-products can be removed simply and effectively. By subsequently conducting an aforementioned hydrophobic solvent washing step, any highly hydrophobic by-products can be effectively removed, enabling a further improvement in the defect reduction effect.

Suitable resins for use with a refining process of the present invention may also comprise another structural unit (a3) in addition to the (a1) units and (a2) units described above.

There are no particular restrictions on the unit (a3), provided it cannot be classified as one of the above units (a1) and (a2). For example, structural units derived from a (meth)acrylate ester comprising a hydroxyl group containing aliphatic polycyclic group are preferred.

The aliphatic polycyclic group may be appropriately selected from the plurality of polycyclic groups listed in the description of the above structural unit (a1).

Specifically, hydroxyl group containing adamantyl groups or carboxyl group containing tetracyclododecanyl groups are preferred as the structural unit (a3).

More specific examples include the structural units represented by the general formula (XI) shown below. The above (a3) units preferably account for 5 to 50 mol %, and even more preferably from 10 to 40 mol % of the total of all the structural units within the resin, as such proportions result in a superior resist pattern shape when the resin is used as a chemically amplified photoresist resin.

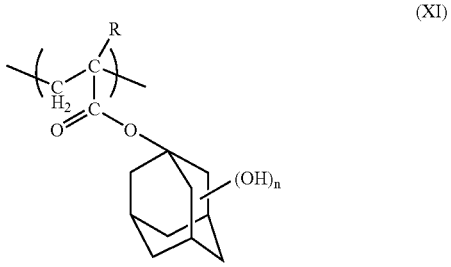

(XI)

(wherein, R represents a hydrogen atom or a methyl group, and n represents an integer of 1 to 3)

In addition, an aforementioned crude resin for an electronic material may comprise two types of units, namely, acrylate ester units and methacrylate ester units, and combinations of these two units results in three types of crude resin, namely, resins containing only acrylate ester units, resins containing only methacrylate ester units, and resins containing both units.

The refining process of the present invention is particularly suited to resins containing only structural units derived from methacrylate esters, and resins containing from 20 to 70 mol % of structural units derived from acrylate esters, and from 30 to 80 mol % of structural units derived from methacrylate esters.

In addition, the latter type of resins containing structural units derived from acrylate esters and structural units derived from methacrylate esters in a specific ratio are prone to the production of oligomer and low molecular weight polymer by-products of differing polarity, due to the difference in polarity of the structural units derived from acrylate esters and the structural units derived from methacrylate esters, although these types of by-products can also be effectively removed using a refining process of the present invention.

As follows is a description of a chemically amplified photoresist composition that can be readily produced using an electronic material resin obtained by the refining process of the present invention described above.

This chemically amplified photoresist composition comprises (A) a resin component (hereafter referred to as component (A)), (B) an acid generator component that generates acid on exposure (hereafter referred to as component (B)), and (C) an organic solvent (hereafter referred to as component (C)). In those cases when an electronic material resin of the present invention is used for a photoresist composition, the resin is used for the component (A) which is either an alkali soluble resin or a resin that can be converted to an alkali soluble state. The former case is a so-called negative photoresist composition, and the latter case a so-called positive photoresist composition.

In the case of a negative type composition, a cross linking agent is added to the photoresist composition with the component (B). Then, during resist pattern formation, when acid is generated from the component (B) by exposure, this acid acts on the cross linking agent, causing cross linking between the component (A) and the cross linking agent, and making the composition alkali insoluble. The cross linking agent typically uses either a compound with a methylol group or an alkyl ether thereof, including amino based resins such as melamine resin, urea resin or glycoluril resin.

In the case of a positive type composition, the component (A) is an alkali insoluble compound with a so-called acid dissociable, dissolution inhibiting group, and when acid is generated from the component (B) by exposure, this acid causes the acid dissociable, dissolution inhibiting group to dissociate, making the component (A) alkali soluble. In this case, the resin must comprise (a1) units and (a2-1) units.

Component (A):

The above types of electronic material resins, obtained using the process for refining an electronic material crude resin according to the present invention, are used.

There are no particular restrictions on the polystyrene equivalent weight average molecular weight of the component (A), as determined by GPC, although values within a range from 5,000 to 30,000 are preferred, and values from 8,000 to 20,000 are even more desirable.

Furthermore, the component (A) can be formed from either one, or two or more different resins, and for example, may utilize one, or two or more of the above types of resins comprising units derived from (meth)acrylate esters as the principal components, or may also utilize a mixture with other conventional photoresist composition resins.

Component (B):

The component (B) can be appropriately selected from known materials used as acid generators in conventional positive and negative chemically amplified resists.

Specific examples include onium salts such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

This component (B) may utilize a single compound, or a combination of two or more compounds. The quantity of the component (B) is typically within a range from 0.5 to 30 parts by weight per 100 parts by weight of the component (A).

Component (C):

The component (C) can be any solvent capable of dissolving the component (A) and the component (B) to generate a uniform solution, and the solvent used can be one, or two or more solvents selected from amongst known solvents used for conventional chemically amplified resists.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more different solvents.

Of these solvents, propylene glycol monomethyl ether acetate (PGMEA) and ethyl lactate (EL) and the like are preferred.

The quantity of the component (C) is sufficient to generate a concentration that is suitable for use as a photoresist composition, and enables application of the composition to a substrate or the like. The quality of the component (C) in the photoresist composition is such as to produce a totally combined solid fraction concentration of 3 to 50% by weight, and preferably from 7 to 20% by weight, in accordance with the resist application thickness.

Other Components:

Other components may also be added to the photoresist composition according to need.

For example, in order to improve the resist pattern shape and the long term stability (post exposure stability of the latent image formed by the pattern wise exposure of the resist layer), an amine, and particularly a secondary lower aliphatic amine or a tertiary lower aliphatic amine, can also be added as an optional component (D).

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine and triethanolamine, and alkanolamines such as triethanolamine are particularly preferred.

These may be used singularly, or in combinations of two or more different compounds.

This amine is typically added in a quantity within a range from 0.01 to 5.0 parts by weight per 100 parts by weight of the component (A).

Furthermore, in order to improve the resist pattern shape and the long term stability in a similar manner to the component (D), an organic carboxylic acid, or a phosphorus oxo acid or derivative thereof can also be added as an optional component (E). Either one, or both of the component (D) and the component (E) can be used.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Miscible additives can also be added to a photoresist composition of the present invention according to need, including additive resins for improving the properties of the resist film, surfactants for improving the ease of application, dissolution inhibitors, plasticizers, stabilizers, colorants and halation prevention agents.

Production of the chemically amplified photoresist composition can be conducted by simply mixing and stirring each of the components together using conventional methods, and where required, the composition may also be mixed and dispersed using a dispersion device such as a dissolver, a homogenizer, or a triple roll mill. Furthermore, following mixing, the composition may also be filtered using a mesh or a membrane filter or the like.

Particularly in the case of a positive photoresist composition for use with an ArF excimer laser, a resin containing both (a1) units and (a2-1) units must be used, and resins that also contain (a3) units, and in some cases (a2-2) units, are preferred as they provide superior characteristics of sensitivity, resolution, and resist pattern shape. In those cases when this type of resin, formed by the polymerization of monomers of differing polarity, is used, it is thought that various monomers, oligomers and other by-products within the resin have a deleterious effect on the long term stability of the photoresist composition. Accordingly, a chemically amplified photoresist composition produced using an electronic material resin according to the present invention displays favorable storage stability as a resist solution, and is less likely to produce defects during resist pattern formation.

The storage stability as a resist solution is evaluated using a liquid particle counter (brand name: Particle Sensor KS-41, manufactured by Rion Co., Ltd.), using a photoresist composition sample that has been stored at room temperature following production. The above counter is a device for counting the number of particles with a particle diameter of at least 0.2 µm, within each 1 $cm^3$. The measurement limit is typically approximately 20,000 particles/$cm^3$.

The quantity of impurities within a photoresist composition immediately following production is typically restricted to no more than 10 particles/$cm^3$. By utilizing the present invention, the storage stability as a resist solution after storage for half a year is preferably essentially unchanged from the stability immediately following production.

A resist pattern using the above type of photoresist composition can be formed using typical methods.

For example, a photoresist composition described above is first applied to the surface of a substrate such as a silicon wafer using a spinner or the like, and a prebake (heat treatment prior to exposure) is conducted under temperature conditions of 80 to 150° C. for 40 to 120 seconds, and preferably for 60 to 90 seconds. Following selective exposure of the resist film with an exposure apparatus, by irradiating KrF, ArF or $F_2$ excimer laser light, or other radiation such as extreme UV, EB (electron beam) or X-ray radiation, through a desired mask pattern, PEB (post exposure baking) is conducted under temperature conditions of 80 to 150° C. for 40 to 120 seconds, and preferably for 60 to 90 seconds. Subsequently, developing is conducted using an alkali developing liquid such as an aqueous solution of tetramethylammonium hydroxide with a concentration of 0.1 to 10% by weight. In this manner, a resist pattern that is faithful to the mask pattern can be obtained.

An organic or inorganic anti-reflective film may also be provided between the substrate and the applied layer of the resist composition.

Defects within the resist pattern can be evaluated by the number of so-called surface defects, measured using, for example, a KLA2132 (brand name) surface defect observation apparatus manufactured by KLA Tencor Corporation.

EXAMPLES

As follows is a more detailed description of the present invention using a series of examples.

The physical properties of the photoresist compositions in each of the following examples and comparative examples were determined in the following manner.

(1) Storage Stability as a Resist Solution

The storage stability as a resist solution of a photoresist composition that had been stored at room temperature following production was evaluated using a liquid particle counter (brand name: KS-41, manufactured by Rion Co., Ltd.).

Measurement upper limit is approximately 20,000 particles/cm$^3$.

Furthermore, the quantity of impurities within a photoresist composition immediately following production was restricted to no more than approximately 10 particles/cm$^3$.

(2) Defects

The prepared photoresist composition (a positive type composition) was applied to a silicon wafer (diameter 200 mm) using a spinner, and was then prebaked and dried on a hotplate at 130° C. for 90 seconds, forming a resist layer with a film thickness of 350 nm.

Subsequently, this layer was selectively irradiated with an ArF excimer laser (193 nm) through a mask pattern, using an ArF exposure apparatus NSR-S302 (manufactured by Nikon Corporation, NA (numerical aperture)=0.60, σ=0.75).

The irradiated resist was then subjected to PEB treatment at 120° C. for 90 seconds, subsequently subjected to puddle development for 60 seconds at 23° C. in a 2.38% by weight aqueous solution of tetramethylammonium hydroxide, and was then washed for 20 seconds with water, and dried, forming a 250 nm line and space pattern.

The number of defects was then measured using a KLA2132 (brand name) surface defect observation apparatus manufactured by KLA Tencor Corporation, thus evaluating the number of defects within the wafer. Three wafers were used in each example and comparative example, and the average value was reported.

Example 1

The monomers (1) to (3) described below were dissolved in 400 ml of tetrahydrofuran, 1.64 g of azobisisobutyronitrile was added as a reaction initiator, and a polymerization reaction was conducted for 3 hours at 70° C.
(1) 16.64 g (40 mol %) of norbornanelactone acrylate (the monomer corresponding with the structural unit (a1), and equivalent to the monomer unit of the above formula (II) wherein R is a hydrogen atom)
(2) 19.84 g (40 mol %) of 2-ethyl-2-adamantyl methacrylate (corresponding with the structural unit (a2-1))
(3) 8.88 g (20 mol %) of 3-hydroxy-1-adamantyl acrylate (corresponding with the structural unit (a3))

Following completion of the polymerization, the reaction liquid was poured into 2500 ml of n-heptane, the resulting mixture was stirred for 30 minutes at 25° C., and the precipitated solid was collected by filtration. This solid was then redissolved in 400 ml of tetrahydrofuran, poured into 2500 ml of heptane, the resulting mixture was stirred for 30 minutes at 25° C., and the precipitated crude resin was collected by filtration.

30 g of the crude resin obtained in the manner described above was dissolved in 345 ml of PGMEA to form an 8% solution, 150 ml of water was added thereto, the mixture was stirred for 5 minutes at 25° C., and following separation of the two layers, the water layer was removed. A further 150 ml of water was then added, the mixture was stirred for 10 minutes at 25° C., and following separation of the two layers, the water layer was once again removed. The resulting PGMEA layer was concentrated and any remaining water removed by distillation, yielding a resin (A-1) for an electronic material. The weight average molecular weight of (A-1) was 20,000.

Analysis of the components extracted from the water layers revealed oligomers of the aforementioned (1), (2) and (3) with molecular weights of less than 1500, in which the mol % values for the units were outside the above specified ratios, and highly hydrophilic oligomers containing more than 40 mol % of units of the component (1).

The components (A) to (D) described below were mixed together and dissolved to prepare a chemically amplified photoresist composition (a positive composition for use with an ArF excimer laser).
Component (A): 100 parts by weight of (A-1) obtained above
Component (B): 3.0 parts by weight of triphenylsulfonium nonafluorobutanesulfonate.
Component (C): 800 parts by weight of a mixed solvent of PGMEA and propylene glycol monomethyl ether (weight ratio 6:4)
Component (D): 0.2 parts by weight of triethanolamine The storage stability as a resist solution of the photoresist composition after storage for 6 months at room temperature was essentially unchanged from the stability observed immediately following production.

The number of defects averaged no more than 5 defects per wafer. Using a measuring SEM S-9220 (manufactured by Hitachi, Ltd.), the defects were identified as so-called bridge type defects in which bridging occurs between line patterns.

Comparative Example 1

With the exception of not conducting the washing operation using PGMEA and water described in the example 1, a resin (A'-1) for an electronic material was produced in the same manner as the example 1. Subsequently, a photoresist was prepared in the same manner as the example 1 with the exception of replacing (A-1) with (A'-1).

As a result, the storage stability as a resist solution following two weeks storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Examples 2 to 7

With the exceptions of altering each of the monomers (1), (2) and (3), and altering the molar ratio of the reactants as shown in Table 1, crude resins were obtained by conducting polymerization reactions in the same manner as the example 1. Subsequently, refined resins were produced in a similar manner to the example 1, by performing a hydrophobic solvent washing step using n-heptane, and a subsequent washing step of the present invention using PGMEA and water.

TABLE 1

| Example Monomer units | Description of each monomer and molar ratio | | | |
|---|---|---|---|---|
| | (a1) units | (a2-1) units | (a3) units | (a2-2) units |
| Crude resin of example 1 | norbornanelactone acrylate (corresponds with the monomer unit of the formula (II) wherein R is a hydrogen atom, hereafter abbreviated NorLac-Ac) 40 mol % | 2-ethyl-2-adamantyl methacrylate (corresponds with the monomer unit of the formula (V) wherein R is a methyl group and R' is an ethyl group, hereafter abbreviated EthAd-Mc) 40 mol % | 3-hydroxy-1-adamantyl acrylate (corresponds with the monomer unit of the formula (XI) wherein R is a hydrogen atom, and a single hydroxyl group is bonded to position 3 of the adamantyl group, hereafter abbreviated as ADOH-Ac) 20 mol % | None |
| Crude resin of example 2 | NorLac-Ac 40 mol % | EthAd-Mc 25 mol % | ADOH-Ac 15 mol % | Tetracyclodecanyl methacrylate (corresponds with the monomer unit of the formula (X) wherein R is a methyl group, hereafter abbreviated as TCD-Mc) 5 mol % |
| Crude resin of example 3 | NorLac-Ac 50 mol % | EthAd-Mc 30 mol % | ADOH-Ac 20 mol % | None |
| Crude resin of example 4 | γ-butyrolactone methacrylate (corresponds with the monomer unit of the formula (IV) wherein R is a methyl group, hereafter abbreviated as γBuLac-Mc) 35 mol % | 2-methyl-2-adamantyl methacrylate (corresponds with the monomer unit of the formula (V) wherein R is a methyl group and R' is a methyl group, hereafter abbreviated MethAd-Mc) 35 mol % | 3-hydroxy-1-adamantyl methacrylate (corresponds with the monomer unit of the formula (XI) wherein R is a methyl group, and a single hydroxyl group is bonded to position 3 of the adamantyl group, hereafter abbreviated ADOH-Mc) 15 mol % | TCD-Mc 15 mol % |
| Crude resin of example 5 | γBuLac-Mc 40 mol % | MethAd-Mc 40 mol % | ADOH-Mc 15 mol % | TCD-Mc 5 mol % |
| Crude resin of example 6 | norbornanelactone acrylate (corresponds with the monomer unit of the formula (III) wherein R is a methyl group) 40 mol % | EthAd-Mc 40 mol % | ADOH-Mc 20 mol % | None |
| Crude resin of example 7 | NorLac-Ac 50 mol % | 2-(1-adamantyl)-2-propyl methacrylate (corresponds with the monomer unit of the formula (VI) wherein R, $R^2$, $R^3$ are methyl groups, hereafter abbreviated iPrAd-Mc) 30 mol % | ADOH-Mc 20 mol % | None |

Subsequently, chemically amplified photoresist composition, and the storage stability as a resist solution and the defects were measured for each composition in the same manner as the example 1. The results are shown in Table 3.

TABLE 2

| | Photoresist Composition | | | |
|---|---|---|---|---|
| Example | (A) Resin component | (B) Acid generator component | (C) Organic solvent component | (D) Amine component |
| Example 1 | Refined resin produced from crude resin of example 1 100 parts by weight | triphenylsulfonium nonafluorobutanesulfonate (hereafter abbreviated as TPS-NFBS) 3.0 parts by weight | PGMEA/PGME (weight ratio 4:6) 800 parts by weight | triethanolamine 0.2 parts by weight |

TABLE 2-continued

| | Photoresist Composition | | | |
|---|---|---|---|---|
| Example | (A) Resin component | (B) Acid generator component | (C) Organic solvent component | (D) Amine component |
| Example 2 | Refined resin produced from crude resin of example 2 100 parts by weight | TPS-NFBS 3.0 parts by weight | EL/PGMEA (weight ratio 4:6) 800 parts by weight | triethanolamine 0.2 parts by weight |
| Example 3 | Refined resin produced from crude resin of example 3 100 parts by weight | TPS-NFBS 3.0 parts by weight | EL/PGMEA (weight ratio 4:6) 800 parts by weight | triethanolamine 0.2 parts by weight |
| Example 4 | Refined resin produced from crude resin of example 4 100 parts by weight | TPS-NFBS 2.0 parts by weight | PGMEA 800 parts by weight | triethanolamine 0.2 parts by weight |
| Example 5 | Refined resin produced from crude resin of example 5 100 parts by weight | TPS-NFBS 3.0 parts by weight | EL/PGMEA (weight ratio 4:6) 800 parts by weight | triethanolamine 0.2 parts by weight |
| Example 6 | Refined resin produced from crude resin of example 6 100 parts by weight | TPS-NFBS 3.0 parts by weight | EL/PGMEA (weight ratio 4:6) 800 parts by weight | triethanolamine 0.2 parts by weight |
| Example 7 | Refined resin produced from crude resin of example 7 100 parts by weight | TPS-NFBS 3.0 parts by weight | EL/PGMEA (weight ratio 4:6) 800 parts by weight | triethanolamine 0.2 parts by weight |

TABLE 3

| | Evaluation Items | |
|---|---|---|
| Example | Storage stability as a resist solution | Defects |
| Example 1 | After storage for 6 months at room temperature, essentially unchanged from stability immediately following production. | Average of no more than 5 defects per wafer |
| Example 2 | After storage for 1 month at room temperature, essentially unchanged from stability immediately following production. | Average of no more than 10 defects per wafer |
| Example 3 | After storage for 1 month at room temperature, essentially unchanged from stability immediately following production. | Average of no more than 10 defects per wafer |
| Example 4 | After storage for 3 months at room temperature, essentially unchanged from stability immediately following production. | Average of no more than 5 defects per wafer |
| Example 5 | After storage for 4 months at room temperature, essentially unchanged from stability immediately following production. | Average of no more than 6 defects per wafer |
| Example 6 | After storage for 4 months at room temperature, essentially unchanged from stability immediately following production. | Average of no more than 6 defects per wafer |
| Example 7 | After storage for 3 months at room temperature, essentially unchanged from stability immediately following production. | Average of no more than 5 defects per wafer |

Comparative Examples 2 to 7

With the exception of performing only the hydrophobic solvent washing step using n-heptane, and omitting the washing step of the present invention using PGMEA and water, crude resins were produced in the same manner as the examples 2 to 7, and using these crude resins, positive photoresist compositions were then prepared in the same manner as the examples 2 to 7.

Subsequently, the storage stability as a resist solution and the defects were measured for each composition in the same manner as the example 1. The results are shown in Table 4.

TABLE 4

| Comparative Example | Evaluation Items | |
|---|---|---|
| | Storage stability as a resist solution | Defects |
| Comparative Example 1 | After storage for 2 weeks at room temperature, measurement limit was exceeded, NG | Average of approximately 60,000 defects per wafer |
| Comparative Example 2 | After storage for 1 month at room temperature, measurement limit was exceeded, NG | Average of approximately 60,000 defects per wafer |
| Comparative Example 3 | After storage for 1 month at room temperature, measurement limit was exceeded, NG | Average of approximately 60,000 defects per wafer |
| Comparative Example 4 | After storage for 1 month at room temperature, measurement limit was exceeded, NG | Average of approximately 3000 defects per wafer |
| Comparative Example 5 | After storage for 1 month at room temperature, measurement limit was exceeded, NG | Average of approximately 60,000 defects per wafer |
| Comparative Example 6 | After storage for 1 month at room temperature, measurement limit was exceeded, NG | Average of approximately 60,000 defects per wafer |
| Comparative Example 7 | After storage for 1 month at room temperature, measurement limit was exceeded, NG | Average of approximately 60,000 defects per wafer |

From the results of the examples and comparative examples described above it is evident that in the examples according to the present invention, employment of a washing step of the present invention enables the effective removal of by-products from the resin, and as a result, the storage stability as a resist solution of a photoresist composition produced using the resin improves markedly. The quantity of defects on formation of a resist pattern is also markedly reduced.

INDUSTRIAL APPLICABILITY

The present invention provides a process for effectively removing by-products such as oligomers contained within a crude resin for an electronic material, thus producing a resin for an electronic material, as well as a resin for an electronic material produced by such a process, a process for producing a chemically amplified photoresist composition using such a resin for an electronic material, and a chemically amplified photoresist composition comprising such a resin for an electronic material, and is consequently extremely useful in industry.

The invention claimed is:

1. A process for refining a crude resin for an electronic material, wherein a crude resin for an electronic material containing (a1) structural units derived from a (meth)acrylate ester with a hydrophilic site is washed using (b1) an organic solvent which is capable of dissolving said crude resin for an electronic material and which separates into two layers when combined with water, and (b2) water.

2. A process for refining a crude resin for an electronic material according to claim 1, wherein said organic solvent (b1) is at least one solvent selected from a group consisting of glycol ether esters, esters and ketones.

3. A process for refining a crude resin for an electronic material according to claim 1, wherein said organic solvent (b1) is at least one solvent selected from a group consisting of propylene glycol monoalkyl ether acetate, ethyl acetate, butyl acetate, isoamyl acetate, 2-heptanone, methyl ethyl ketone, methyl isobutyl ketone, and cyclohexanone.

4. A process for refining a crude resin for an electronic material according to claim 3, wherein said propylene glycol monoalkyl ether acetate is propylene glycol monomethyl ether acetate.

5. A process for refining a crude resin for an electronic material according to claim 1, wherein prior to, following, or both prior to and following said washing, said crude resin for an electronic material is washed using a hydrophobic solvent.

6. A process for refining a crude resin for an electronic material according to claim 1, wherein said crude resin for an electronic material is a resin used for preparing a chemically amplified photoresist composition.

7. A process for refining a crude resin for an electronic material according to claim 1, wherein said crude resin for an electronic material comprises at least 20 mol % of said (a1) units.

8. A process for refining a crude resin for an electronic material according to claim 1, wherein said hydrophilic site is a lactone unit.

9. A process for refining a crude resin for an electronic material according to claim 1, wherein said crude resin for an electronic material is a resin comprising said (a1) units and (a2) structural units derived from a (meth)acrylate ester containing a hydrophobic group.

10. A process for refining a crude resin for an electronic material according to claim 9, wherein said hydrophobic group in said (a2) units is an aliphatic polycyclic hydrocarbon group.

11. A process for refining a crude resin for an electronic material according to claim 1, wherein said crude resin for an electronic material comprises from 20 to 60 mol % of said (a1) units, and from 5 to 50 mol % of said (a2) units.

12. A process for refining a crude resin for an electronic material according to claim 1, wherein said crude resin for an electronic material is a resin formed solely from structural units derived from a methacrylate ester.

13. A process for refining a crude resin for an electronic material according to claim 1, wherein said crude resin for an electronic material comprises from 20 to 70 mol % of structural units derived from an acrylate ester, and from 30 to 80 mol % of structural units derived from a methacrylate ester.

14. A process for refining a crude resin for an electronic material according to claim 1, wherein during said washing, said crude resin for an electronic material is dissolved in said organic solvent (b1), water (b2) is then added, and following separation into two layers, a water layer is removed.

* * * * *